United States Patent
Shim et al.

(10) Patent No.: US 7,656,150 B2
(45) Date of Patent: Feb. 2, 2010

(54) TEST HANDLER AND LOADING METHOD THEREOF

(75) Inventors: Jae-Gyun Shim, Suwon (KR); Yun-Sung Na, Cheunan (KR); In-Gu Jeon, Suwon (KR); Tae-Hung Ku, Suwon (KR); Hyun-Jun Yoo, Suwon (KR)

(73) Assignee: TechWing Co., Ltd., Hwaseung (KR)

( * ) Notice: Subject to any disclaimer, the term of this patent is extended or adjusted under 35 U.S.C. 154(b) by 0 days.

(21) Appl. No.: 11/627,276

(22) Filed: Jan. 25, 2007

(65) Prior Publication Data

US 2007/0176620 A1    Aug. 2, 2007

(30) Foreign Application Priority Data

Jan. 25, 2006    (KR) .................... 10-2006-0007763

(51) Int. Cl.
*G01R 31/28* (2006.01)
(52) U.S. Cl. .................................. 324/158.1
(58) Field of Classification Search ............... 324/158.1
See application file for complete search history.

(56) References Cited

U.S. PATENT DOCUMENTS

| | | | | |
|---|---|---|---|---|
| 5,839,769 A * | 11/1998 | Slocum et al. | ............. | 294/87.1 |
| 6,870,360 B2 * | 3/2005 | Hwang | .................... | 324/158.1 |
| 7,196,508 B2 * | 3/2007 | Ham et al. | ................ | 324/158.1 |
| 2005/0168214 A1 * | 8/2005 | Kim | ........................ | 324/158.1 |
| 2006/0119345 A1 * | 6/2006 | Ham et al. | ................ | 324/158.1 |

FOREIGN PATENT DOCUMENTS

KR    1020030041208 A1    5/2004

* cited by examiner

*Primary Examiner*—Ha Tran T Nguyen
*Assistant Examiner*—Shaun Campbell
(74) *Attorney, Agent, or Firm*—Jefferson IP Law, LLP

(57) ABSTRACT

When a test handler loads semiconductor devices of user trays onto a test tray, the test handler adjusts a front/rear pitch or a right/left pitch between the semiconductor devices, adjusts the right/left pitch or the front/rear pitch, and loads the semiconductor devices. The test handler can sequentially adjust individually the front/rear pitch and the right/left pitch between the semiconductor devices, thereby reducing the apparatus weight and the loading time.

7 Claims, 11 Drawing Sheets

(Conventional Art)

(Conventional Art)

TEST HANDLER AND LOADING METHOD THEREOF

CROSS-REFERENCE TO RELATED APPLICATIONS

This application claims the benefit under 35 U.S.C. 119(a) of Korean Patent Application No. 10-2006-0007763, filed on Jan. 25, 2006 in the Korean Intellectual Property Office, the entire disclosure of which is hereby incorporated by reference.

BACKGROUND OF THE INVENTION

1. Field of the Invention

The present invention relates to a test handler, and more particularly to an apparatus and method for loading semiconductor devices of user trays onto a test tray.

2. Description of the Related Art

In general, a test handler supports a test of semiconductor devices manufactured through a predetermined manufacturing process, sorts the semiconductor devices into different levels according to the test results, and loads the semiconductor devices onto user trays. The test handler has been disclosed in many publication documents.

FIG. 1 is a schematic perspective view illustrating a conventional test handler 100. The major parts of the conventional test handler 100 will now be briefly explained with reference to FIG. 1.

The conventional test handler 100 includes a loading unit 110, a soak chamber 120, a test chamber 130, a de-soak chamber 140, and an unloading unit 150.

The loading unit 110 picks semiconductor devices loaded on user trays 10a and 10b, adjusts a front/rear pitch and a right/left pitch between the semiconductor devices, aligns the semiconductor devices at an alignment block 112, and loads the semiconductor devices onto a test tray 11.

The soak chamber 120 has a temperature environment for preheating or precooling the semiconductor devices loaded on the test tray 11, and receives the test tray 11 on which the semiconductor devices have been loaded by the loading unit 110. The test tray 11 entering the soak chamber 120 is translated toward the test chamber 130 in the vertical posture. During the translation, the semiconductor devices loaded on the test tray 11 are sufficiently preheated or precooled.

The test chamber 130, installed with the test handler, includes a tester which tests the semiconductor devices loaded on two test trays 11 supplied from the soak chamber 120. For this, the test chamber 130 has a temperature environment for testing the semiconductor devices.

The de-soak chamber (or restoring chamber) 140 restores the heated or cooled semiconductor devices to room temperature.

The unloading unit 150 sorts the semiconductor devices transferred from the de-soak chamber 140 into different levels, and unloads (transfers and loads) the semiconductor devices onto user trays 10c.

Here, since the user trays load the semiconductor devices for keeping, the front/rear pitch and the right/left pitch between the semiconductor devices must be minimized to keep as many semiconductor devices as possible. However, the semiconductor devices loaded on the test tray must have appropriate front/rear pitch and right/left pitch for test. As shown in the user trays 10a and 10b and the test tray 11 of FIG. 2, the front/rear pitch b' and the right/left pitch a' between the semiconductor devices loaded on the test tray 11 must be greater than the front/rear pitch b and the right/left pitch a between the semiconductor devices loaded on the user trays 10a and 10b.

The loading method of the test handler 100 of FIG. 1 will now be described in more detail with reference to FIG. 2, a schematic plan view illustrating the major elements of the test handler 100 of FIG. 1.

As shown in FIG. 2, the loading unit 110 includes a picking apparatus 110a (called a pick and place apparatus or a loader hand) that has 8 pickers 110a-1 in its front and rear rows, respectively, to pick up 16 semiconductor devices at a time. The picking apparatus 110a carries out the loading operation. As described above, in order to load the semiconductor devices of the user tray 10a or 10b onto the test tray 11, it is necessary to adjust the different pitches between the semiconductor devices. Therefore, the front/rear pitch and the right/left pitch between the pickers 110a-1 must be adjustable. That is, when the picking apparatus 110a picks the semiconductor devices from the user tray 10a or 10b, the front/rear pitch and the right/left pitch between the pickers 110a-1 must be minimized to the pitches between the semiconductor devices loaded onto the user tray 10a or 10b. And, when the picking apparatus 110a loads the semiconductor devices onto the test tray 11, the front/rear pitch and the right/left pitch between the pickers 110a-1 must be maximized. Accordingly, the picking apparatus 110a needs an apparatus that adjusts the pitch between the front and the rear rows, and an apparatus that adjusts the pitch between the pickers 110a-1 arranged in each row.

The picking apparatus 110a picks the 16 semiconductor devices from the user tray 10a or 10b, widens the pitch between the front and the rear rows and the pitch between the pickers 110a-1 arranged in each row, aligns the semiconductor devices at the alignment block 112, and loads the semiconductor devices onto the test tray 11.

However, since the picking apparatus 110a requires the apparatus that adjusts the pitch between the front row and the rear row and the apparatus that adjusts the pitch between the pickers 110a-1 arranged in each row, such a configuration makes it complicated and increases its weight. Accordingly, it is disadvantageous in that the loading time increases because inertia caused by its heavy weight decreases its moving speed.

Furthermore, when the picking apparatus 110a picks the semiconductor devices from the user tray 10a or 10b and adjusts the front/rear pitch and the right/left pitch, the semiconductor devices picked by the pickers 110a-1 becomes misaligned. The semiconductor devices are realigned at the alignment block 112 and loaded onto the test tray 11. As a result, the entire loading time increases due to the realignment of the semiconductor devices using the alignment block 112.

SUMMARY OF THE INVENTION

Therefore, exemplary embodiments of the present invention have been made in view of the above problems, and it is an object of the present invention to provide a technique of sequentially adjusting a front/rear pitch and a right/left pitch between semiconductor devices, and of individually performing the sequential pitch adjustments, when the semiconductor devices are loaded from user trays onto a test tray.

In accordance with an aspect of the present invention, the above object can be accomplished by the provision of a test handler comprising: a loading unit for loading semiconductor devices of user trays onto a test tray; a test chamber in which a tester tests the semiconductor devices loaded on the test tray by the loading unit; and an unloading unit for unloading the semiconductor devices tested in the test chamber from the test tray onto user trays. Here, the loading unit may include: at least one moving type loading table reciprocating between a first region and a second region, and having device-settling cells arranged to have a pitch more widened in at least one direction than a pitch between the semiconductor devices loaded on the user trays; a first picking apparatus moving in the first region to transfer and load the semiconductor devices from the user trays to the device-settling cells of the moving type loading table positioned in the first region; and a second picking apparatus moving in the second region to transfer and load the semiconductor devices from the device-settling cells of the moving type loading table positioned in the second region to the test tray.

In accordance with another aspect of the present invention, there is provided a test handler, comprising: a loading unit for loading semiconductor devices of user trays onto a test tray; a test chamber in which a tester tests the semiconductor devices loaded on the test tray by the loading unit; and an unloading unit for unloading the semiconductor devices tested in the test chamber from the test tray onto user trays. Here, the loading unit may include: at least one moving type loading table reciprocating between a first loading position and a second loading position; a first picking apparatus for adjusting a front/rear pitch between the semiconductor devices in transferring and loading the semiconductor devices from the user trays onto the moving type loading table positioned in the first loading position; and a second picking apparatus for transferring and loading the semiconductor devices from the moving type loading table positioned in the second loading position onto the test tray.

In an exemplary embodiment, the first picking apparatus includes multiple rows which have a plurality of pickers arranged in a right/left direction, and adjusts a pitch between front and rear rows during the movement, for adjusting the front/rear pitch between the semiconductor devices.

In an exemplary embodiment, the second picking apparatus adjusts a right/left pitch between the semiconductor devices in transferring and loading the semiconductor devices.

In an exemplary embodiment, the second picking apparatus includes multiple columns which have a plurality of pickers arranged in a front/rear direction, and adjusts a pitch between right and left columns during the movement for adjusting the right/left pitch between the semiconductor devices.

In an exemplary embodiment, the second picking apparatus is movable only to the right/left direction.

In accordance with further another aspect of the present invention, there is provided a test handler, comprising: a loading unit for loading semiconductor devices of a user tray onto a test tray; a test chamber in which a tester tests the semiconductor devices loaded on the test tray by the loading unit; and an unloading unit for unloading the semiconductor devices tested in the test chamber from the test tray onto user trays. Here, the loading unit may include: at least one moving type loading table reciprocating between a first loading position and a second loading position; a first picking apparatus for adjusting a right/left pitch between the semiconductor devices in transferring and loading the semiconductor devices from the user trays onto the moving type loading table positioned in the first loading position; and a second picking apparatus for transferring and loading the semiconductor devices from the moving type loading table positioned in the second loading position onto the test tray.

In an exemplary embodiment, the second picking apparatus adjusts a front/rear pitch between the semiconductor devices in transferring and loading the semiconductor devices.

In an exemplary embodiment, at least one moving type loading table includes a first moving type loading table and a second moving type loading table reciprocated independently of each other.

In accordance with still another aspect of the present invention, there is provided a method of loading semiconductor devices of user trays onto a test tray in a test handler, comprising the steps of: adjusting a front/rear pitch between the semiconductor devices; adjusting a right/left pitch between the semiconductor devices; and loading the semiconductor devices onto the test tray.

In accordance with yet another aspect of the present invention, there is provided a method of loading semiconductor devices of user trays onto a test tray in a test handler, comprising the steps of: adjusting a right/left pitch between the semiconductor devices; adjusting a front/rear pitch between the semiconductor devices; and loading the semiconductor devices onto the test tray.

BRIEF DESCRIPTION OF THE DRAWINGS

The above and other exemplary objects, features and other advantages of the present invention will be more clearly understood from the following detailed description taken in conjunction with the accompanying drawings, in which.

DESCRIPTION OF THE EXEMPLARY EMBODIMENTS

Figure 1:
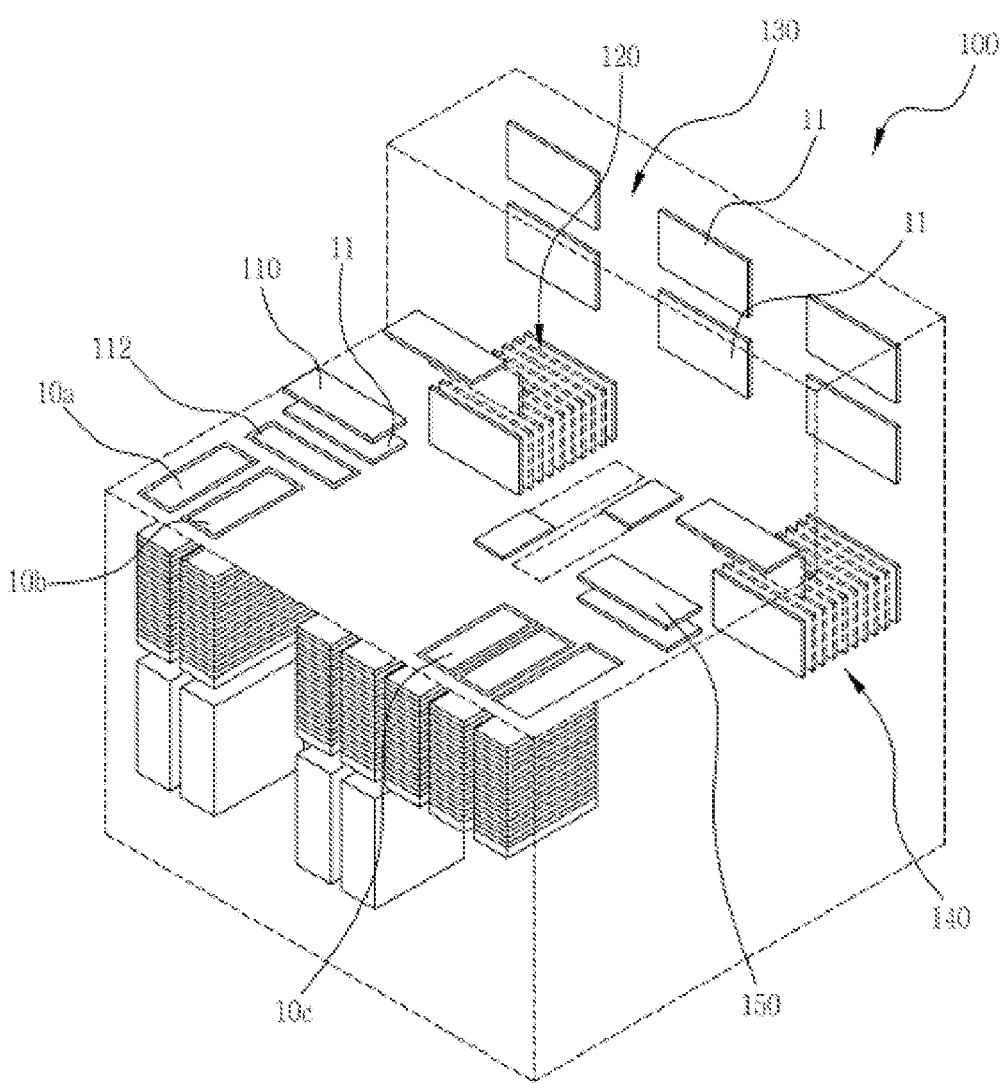
FIG. 1 is a schematic perspective view illustrating a conventional test handler.
Figure 2:
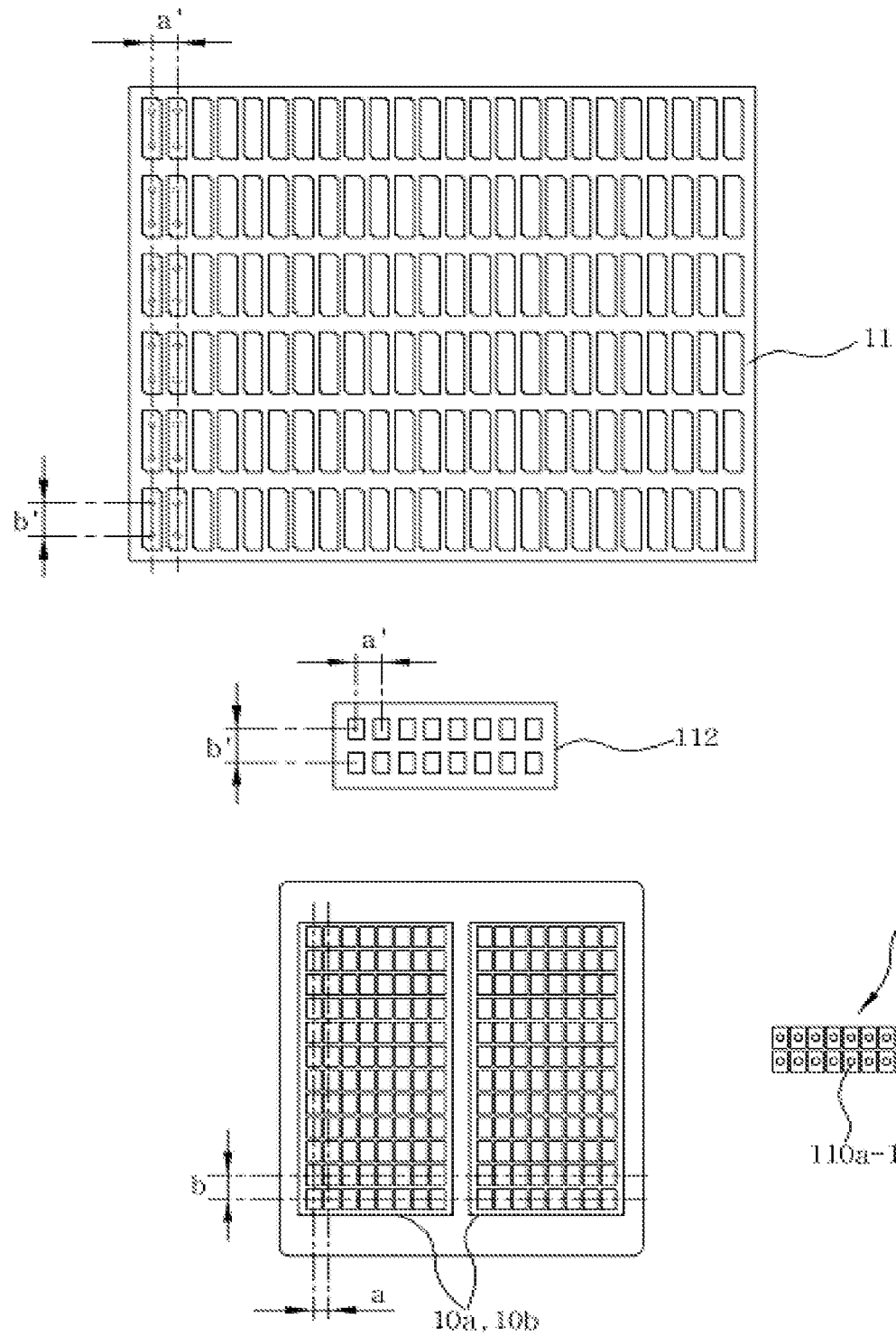
FIG. 2 is a plan view illustrating major elements of the test handler of FIG. 1.

Now, exemplary embodiments of the present invention will be described in detail with reference to the annexed drawings. The same or similar elements are denoted by the same reference numerals even though they are depicted in different drawings. The same, similar, or well-known technical contents are omitted or briefly mentioned.

First Embodiment

According to a first embodiment of the present invention, a test handler picks up semiconductor devices from user trays, adjusts a front/rear pitch between the semiconductor devices, adjusts a right/left pitch between the semiconductor devices, and loads the semiconductor devices onto a test tray.

Figure 3:
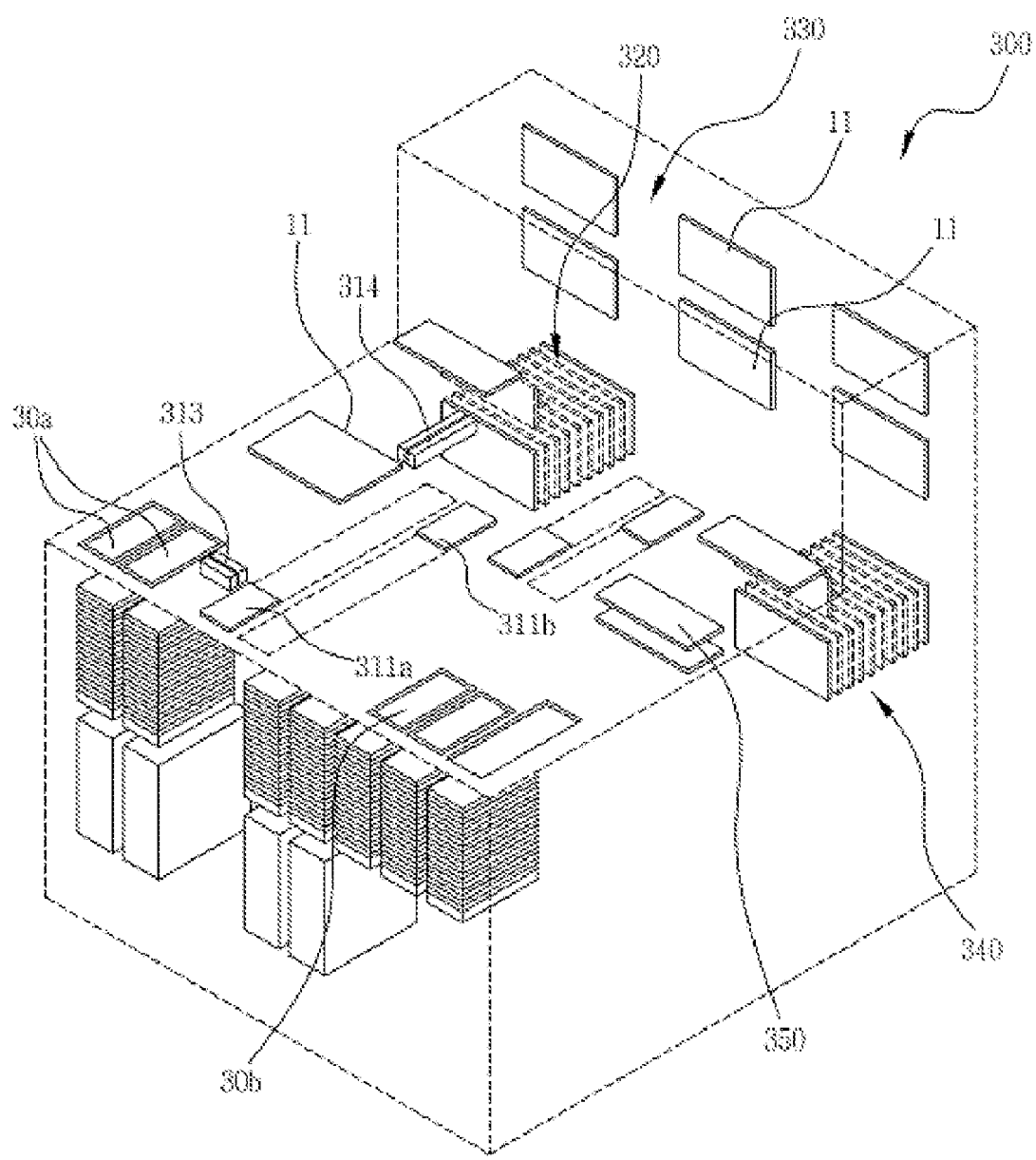
FIG. 3 is a schematic perspective view illustrating a test handler according to a first embodiment of the present invention.

FIG. 3 is a schematic perspective view illustrating a test handler 300 according to a first embodiment of the present invention.

Referring to FIG. 3, the test handler 300 includes a loading unit, a soak chamber 320, a test chamber 330, a de-soak chamber 340 and an unloading unit 350.

The loading unit for loading semiconductor devices of user trays 30a onto a test tray 11 includes a first moving type loading table 311a, a second moving type loading table 311b, a power apparatus, a first picking apparatus 313, and a second picking apparatus 314. The loading unit will later be explained in detail.

The soak chamber 320 has a temperature environment for preheating or precooling the semiconductor devices loaded on the test tray 11, and receives the test trays 11 on which the semiconductor devices have been loaded by a loading operation.

The test chamber 330 includes a tester which tests the semiconductor devices loaded on the test tray 11 supplied from the soak chamber 320.

The de-soak chamber 340 restores the heated or cooled semiconductor devices to room temperature.

The unloading unit 350 sorts the semiconductor devices loaded on the test tray 11 supplied from the de-soak chamber 340 into different levels, and unloads the semiconductor devices onto user trays 30b.

Figure 4:
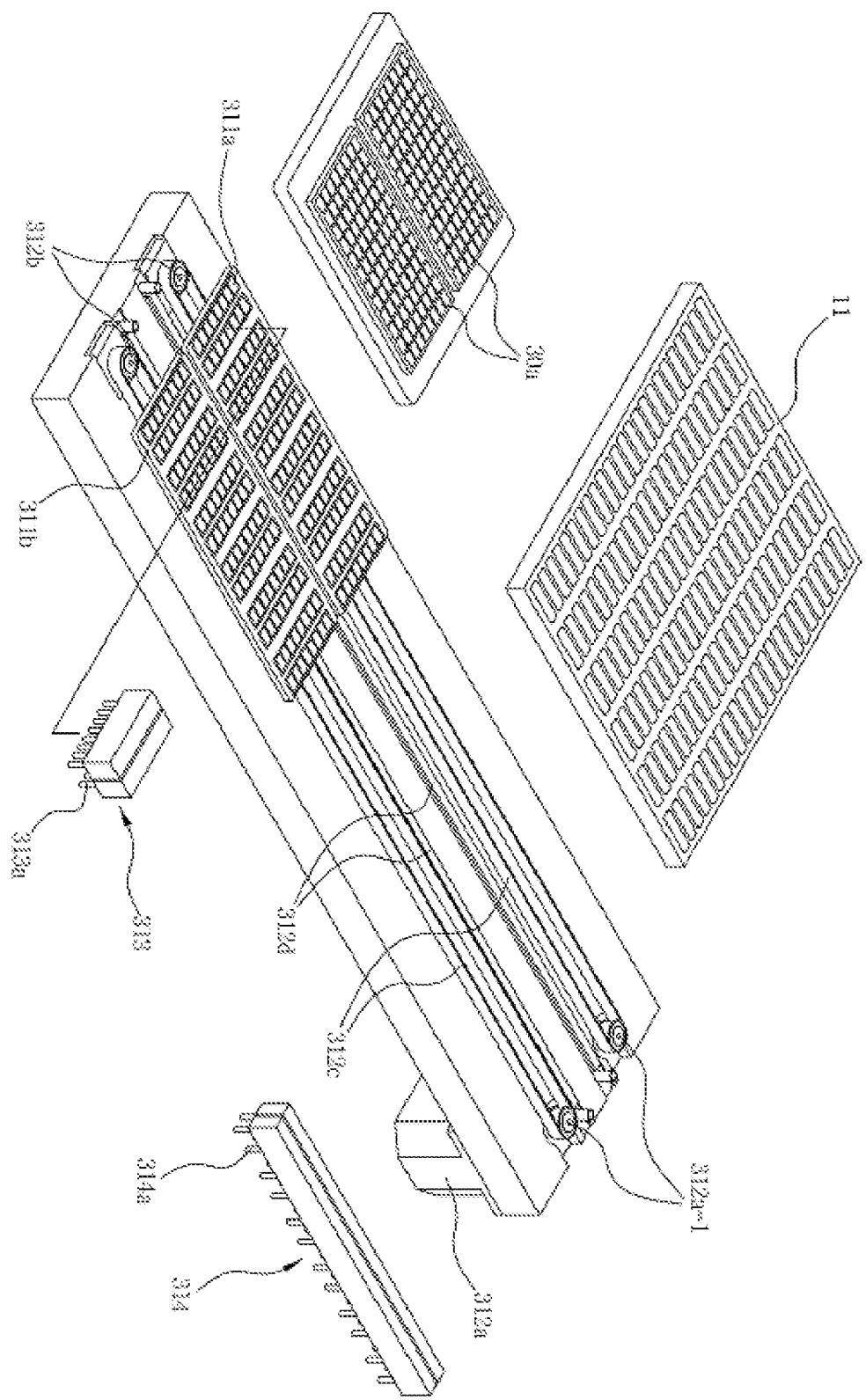
FIG. 4 is a schematic perspective view illustrating major elements of the test handler of FIG. 3.
Figure 5:
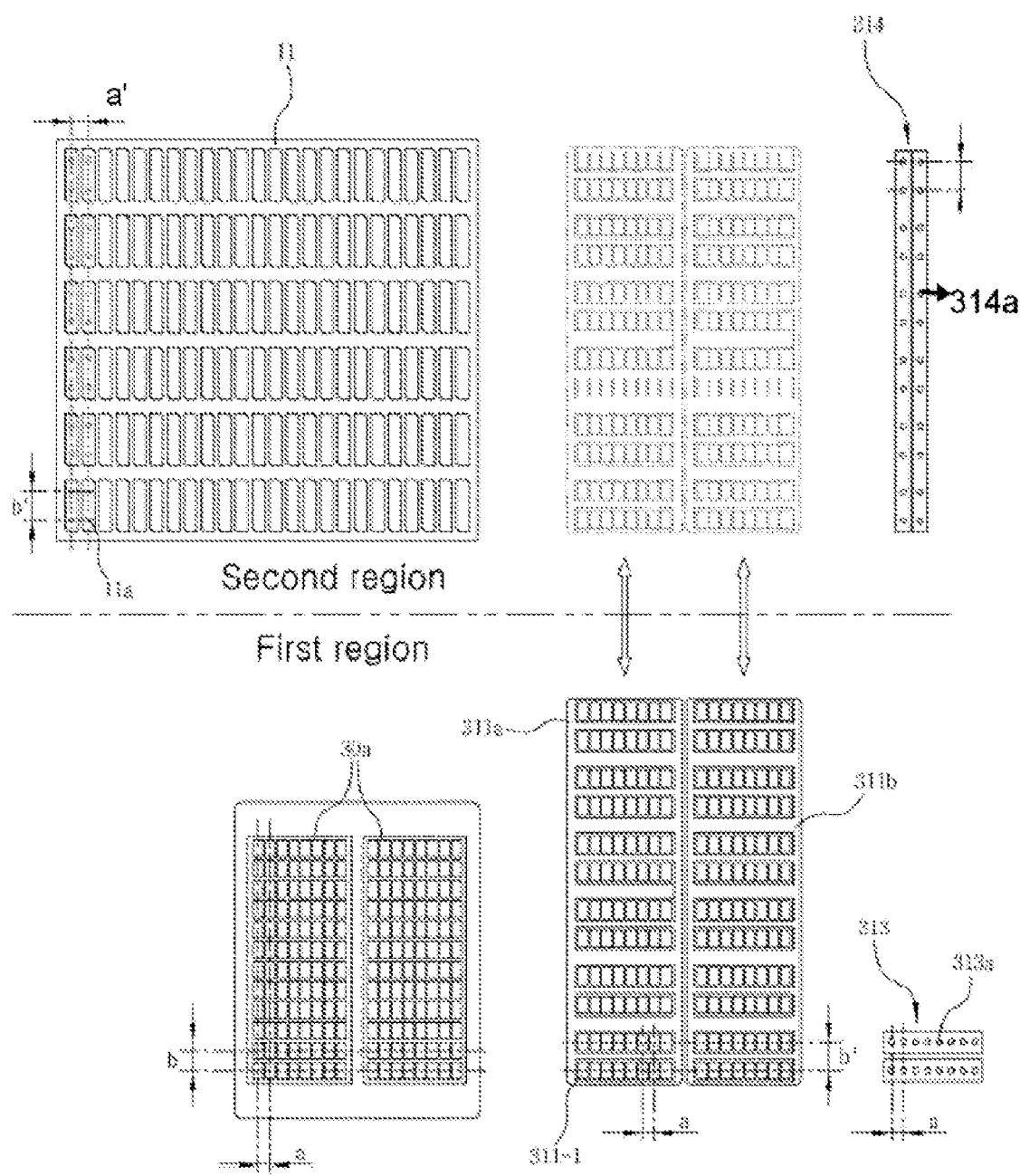
FIG. 5 is a schematic plan view illustrating major elements of the test handler of FIG. 3.

FIG. 4 is a schematic perspective view illustrating major elements of the test handler 300 of FIG. 3, and FIG. 5 is a schematic plan view illustrating major elements of the test handler 300 of FIG. 3.

Referring to FIG. 4, as mentioned above, the loading unit includes the first moving type loading table 311a, the second moving type loading table 311b, the power apparatus, the first picking apparatus 313 and the second picking apparatus 314.

The two moving type loading tables 311a and 311b are reciprocated in the front/rear direction between a first loading position situated at the side of the user tray 30a and a second loading position situated at the side of the test tray 11, and arranged in parallel with each other in the right and left sides. As shown in FIG. 3, the power apparatus explained below reciprocates the two moving type loading tables 311a and 311b independently of each other. In addition, as shown in FIG. 5, a front/rear pitch b' between device-settling cells 311-1 is identical to a front/rear pitch b' between device-settling cells 11a of the test tray 11, and a right/left pitch a between the device-settling cells 311-1 is identical to a right/left pitch a between the semiconductor devices loaded on the user trays 30a. The semiconductor devices are stably aligned on the device-settling cells 311-1 of the moving type loading tables 311a and 311b. From another point of view (for example, when the front portion in which the user trays 30a are positioned is a first region and the rear portion in which the test tray 11 is positioned is a second region) the moving type loading tables 311a and 311b are reciprocated independently of each other between the first region where the first loading position is and the second region where the second loading position is. The front/rear pitch b' between the device-settling cells 311-1 of the moving type loading tables 311a and 311b is wider than the front/rear pitch b between the semiconductor devices loaded on the user trays 30a, so that the semiconductor devices transferred by the first picking apparatus 313 (explained later) can be loaded with their widened front/rear pitch. Since the semiconductor devices misaligned in the pitch adjustment of the first picking apparatus 313 are realigned on the moving type loading tables 311a and 311b, an additional aligner is not needed.

Still referring to FIG. 4, the power apparatus supplies power for reciprocating the two moving type loading tables 311a and 311b in the front/rear direction. For this, the power apparatus may include: a pair of motors 312a having a pair of driving pulleys 312a-1; a pair of driven pulleys 312b corresponding to the driving pulleys 312a-1; a pair of belts 312c rotated by the driving pulleys 312a-1 and the driven pulleys 312b and coupled to the moving type loading tables 311a and 311b; and a pair of LM guides 312d for guiding movements of the moving type loading tables 311a and 311b (a motor for reciprocating the first moving type loading table 311a is not shown). When the belts 312c are rotated by the motors 312a, the moving type loading tables 311a and 311b are moved in the front/rear direction along the LM guides 312d. Since the operations of the pair of motors 312a are individually controlled, the two moving type loading tables 311a and 311b can be reciprocated independently of each other. The power apparatus can be implemented with various mechanical configurations, for example, a cylinder, and the like.

The first picking apparatus 313 includes 8 pickers 313a in its front and rear rows, respectively. As illustrated in FIG. 5, a front/rear pitch between the front row pickers 313a and the rear row pickers 313a is adjustable, and a right/left pitch a between the pickers 313a arranged in each row is fixed identically to the right/left pitch a between the semiconductor devices of the user trays 30a. That is, since the right/left pitch a between the pickers 313a is fixed, the first picking apparatus 313 does not need an apparatus to adjust the right/left pitch a between the pickers 313a, thereby reducing the weight.

The second picking apparatus 314 includes 12 pickers 314a in its right and left rows, respectively. The pickers 314a are arranged in the front/rear direction. Still referring to FIG. 5, a pitch between the right row pickers 314a and the left row pickers 314a is adjustable, and a front/rear pitch b' between the pickers 314a arranged in the front/rear direction in each row is fixed identically to the front/rear pitch b' between the device-settling cells 11a of the test tray 11. Since the front/rear pitch b' between the pickers 314a is fixed, the second picking apparatus 314 does not need an apparatus to adjust the front/rear pitch b' between the pickers 314a, thereby reducing the weight. As shown in FIG. 5, the second picking apparatus 314 includes the 12 pickers 314a in its right and left rows in the front/rear direction, respectively, and the test tray 11 includes the 12 device-settling cells 11a in the front/rear direction. Accordingly, the second picking apparatus 314 only moves in the right/left direction. As a result, the second picking apparatus 314 can be reduced in weight by omitting a mechanical apparatus for moving the second picking apparatus 314 in the front/rear direction, and operated at a high speed by decreasing the moving distance due to the linear movement. In addition, because the second picking apparatus 314 adjusts only the right/left pitch between the semiconductor devices, the semiconductor devices are little misaligned to be appropriately loaded onto the test tray 11. Therefore, the second picking apparatus 314 can directly load the semiconductor devices of the moving type loading tables 311a and 311b onto the test tray 11 without realigning the semiconductor devices.

The adjustments of front/rear pitch and right/left pitch have been publicly known and thus detailed descriptions thereof are omitted.

A loading method of the test handler 300 will now be described with reference to FIGS. 6 to 10.

Figure 6:
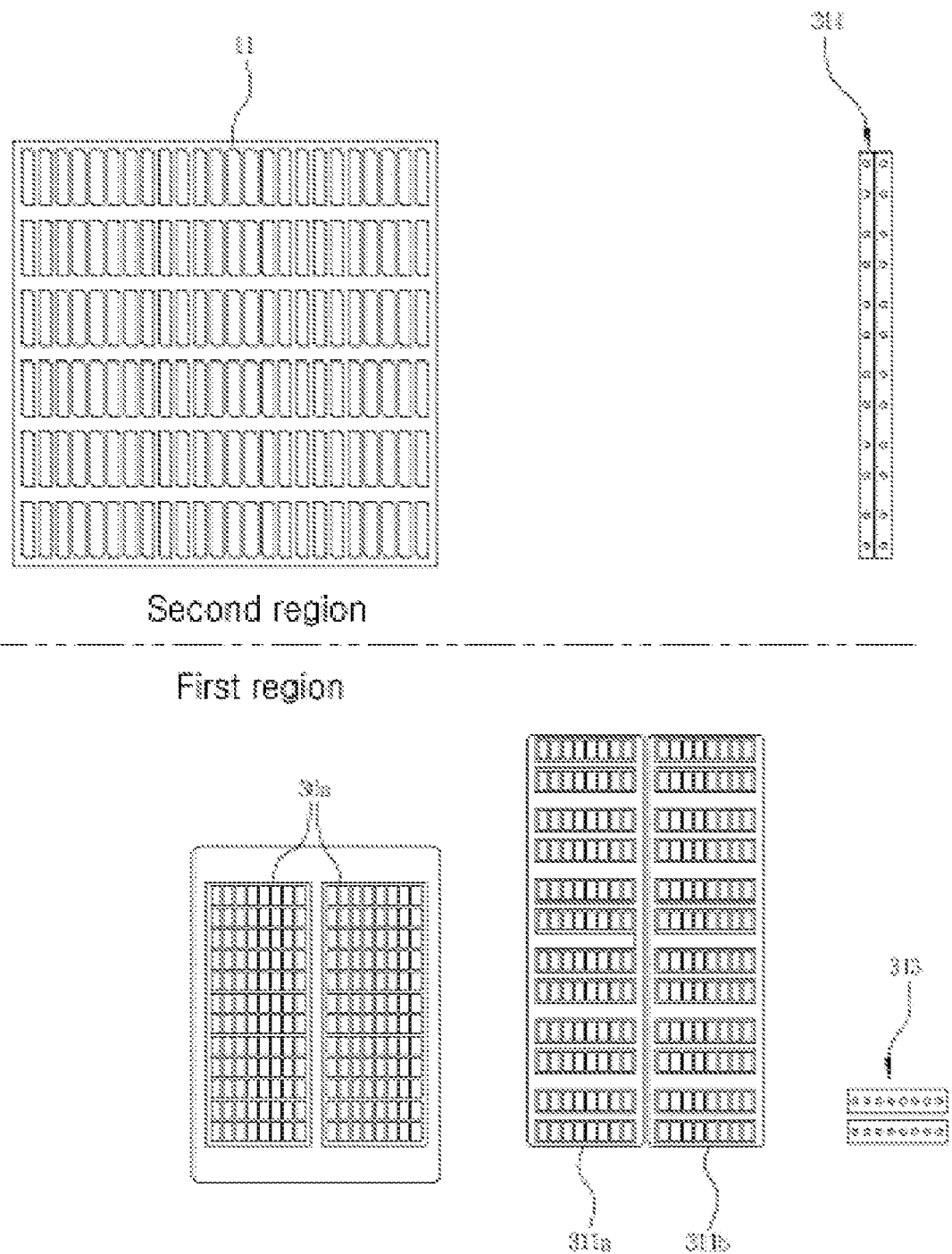
FIGS. 6 to 10 are views for describing states illustrating major elements of the test handler of FIG. 3 when the test handler performs loading operations.
Figure 7:
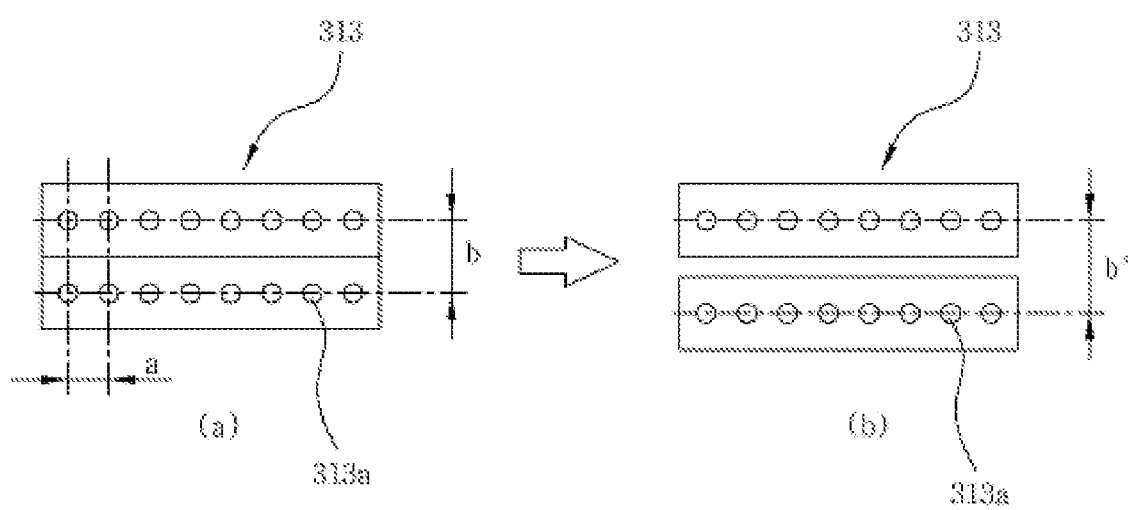

At an initial stage, as shown in FIG. 6, the moving type loading tables 311a and 311b are positioned at the side of the user trays 30a which are in a first loading position existing in the first region. The first picking apparatus 313 picks up the 16 semiconductor devices from the user trays 30a, widens the front/rear pitch, and loads the semiconductor devices onto the first moving type loading table 311a. As illustrated in FIG. 7, when the first picking apparatus 313 picks up the semiconductor devices from the user trays 30a, the front/rear pitch between the pickers 313a is identical to the front/rear pitch b between the semiconductor devices of the user trays 30a, thereby maintaining the minimum pitch state of FIG. 7(a). When the first picking apparatus 313 loads the semiconductor devices onto the first moving type loading table 311a, the pitch between the front and rear row pickers 313a is widened to the front/rear pitch b' between the device-settling cells 311-1 of the first moving type loading table 311a, thereby reaching the state of FIG. 7(b).

Figure 8:
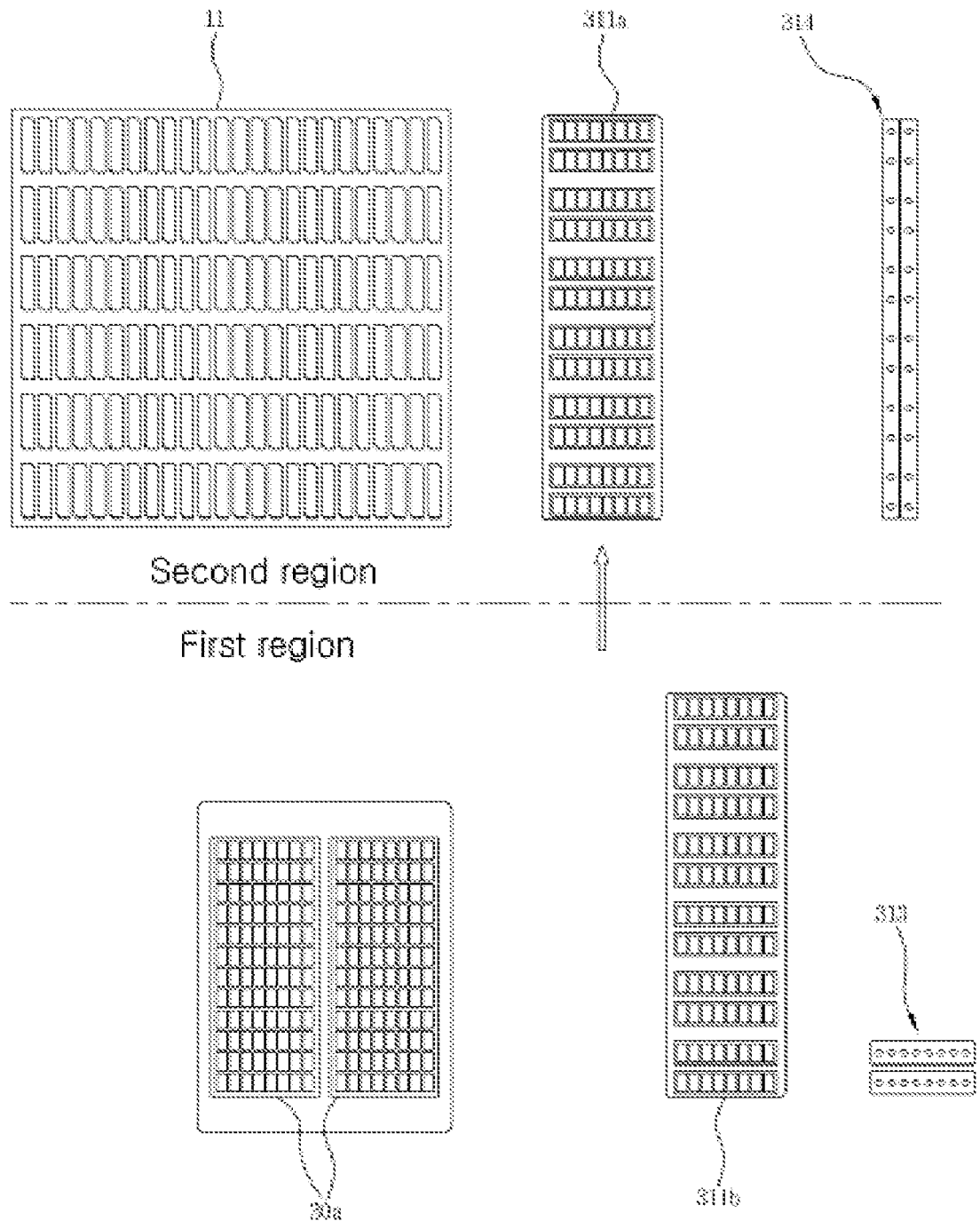
Figure 9:
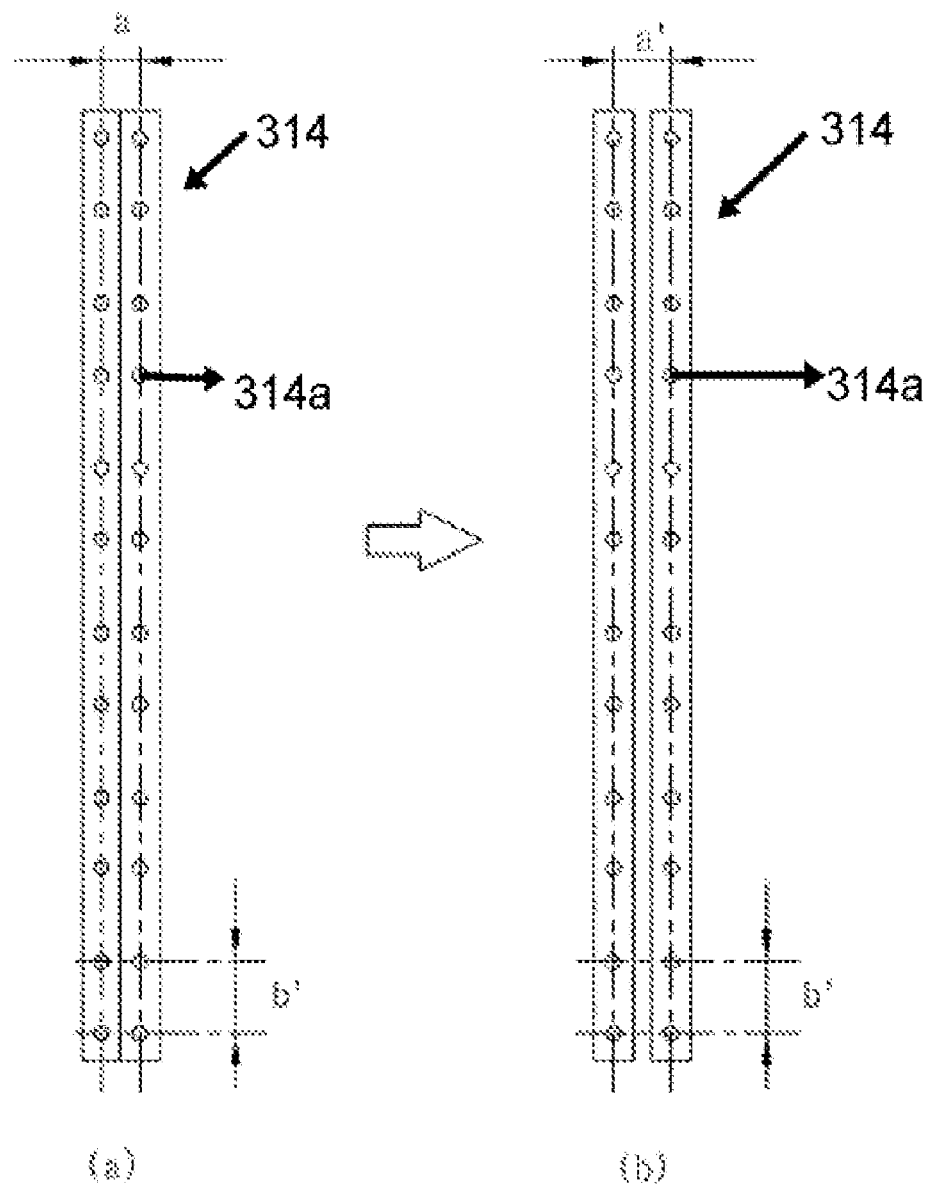

After the first picking apparatus 313 completely loads the semiconductor devices onto the first moving type loading table 311a, as depicted in FIG. 8, the first moving type loading table 311a moves from the first loading position of the first region to the second loading position of the second region in the rear side. The second picking apparatus 314 picks up the 24 semiconductor devices from the first moving type loading table 311a positioned in the second loading position of the second region, widens the right/left pitch between the semiconductor devices, and loads the semiconductor devices onto the test tray 11. As illustrated in FIG. 9, when the second picking apparatus 314 picks up the semiconductor devices from the first moving type loading table 311a, the right/left pitch between the pickers 314a is identical to the pitch a between the semiconductor devices of the first moving type loading table 311a, thereby maintaining the minimum pitch state of FIG. 9(a). When the second picking apparatus 314 loads the semiconductor devices onto the test tray 11, the pitch between the right and left row pickers 314a is widened to the right/left pitch a' between the device-settling cells 11a of the test tray 11, thereby reaching the state of FIG. 9(b). On the other hand, the first picking apparatus 313 continuously transfers and loads the semiconductor devices from the user trays 30a to the second moving type loading table 311b.

Figure 10:
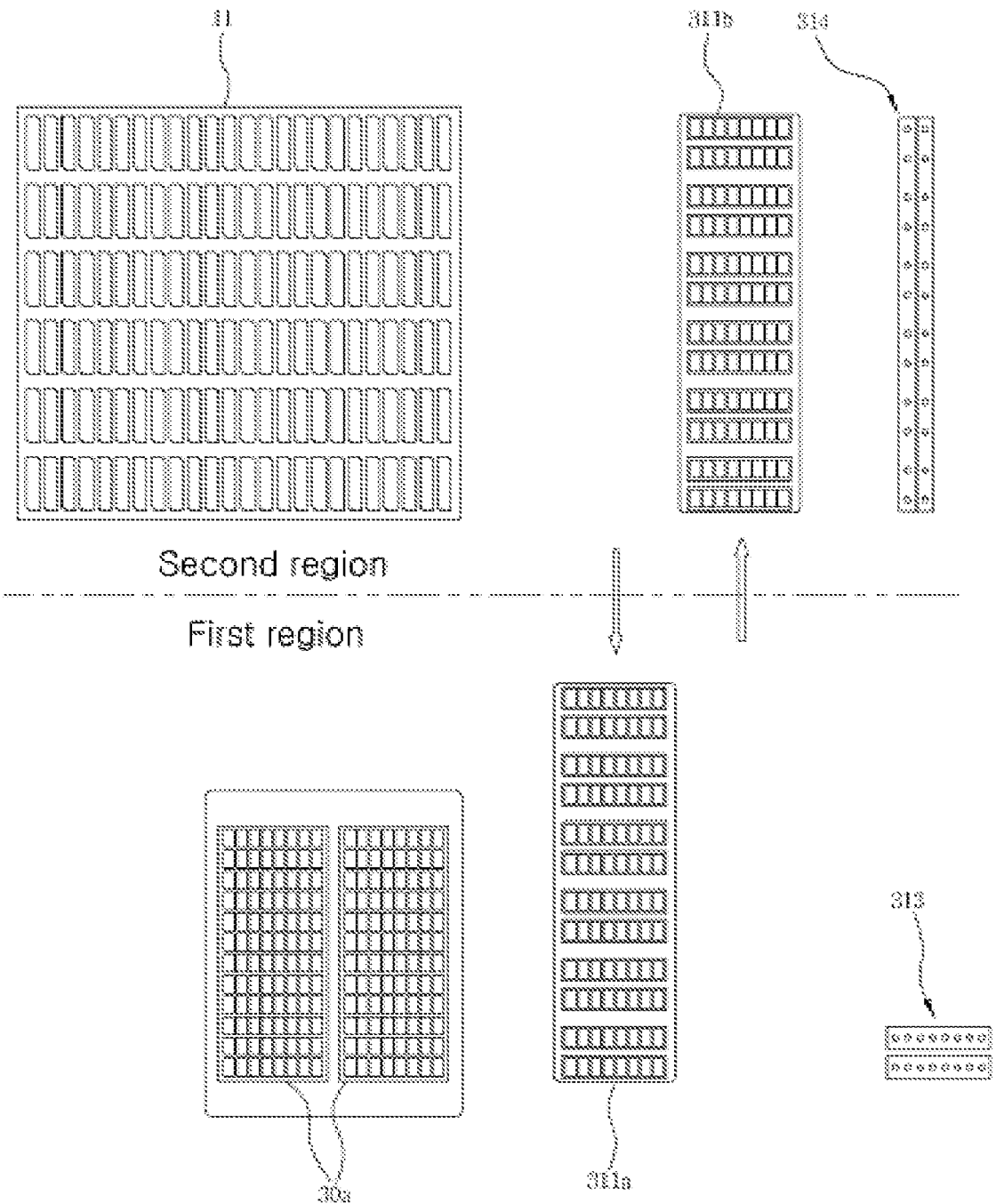

When the second picking apparatus 314 transfers and completely loads the semiconductor devices from the first moving type loading table 311a onto the test tray 11, as shown in FIG. 10, the first moving type loading table 311a moves to the first loading position of the first region. Then the second moving type loading table 311b on which the semiconductor devices have been loaded by the first picking apparatus 313 moves to the second loading position of the second region. Accordingly, the first picking apparatus 313 transfers and loads the semiconductor devices from the user trays 30a to the first moving type loading table 311a, and the second picking apparatus 314 transfers and loads the semiconductor devices from the second moving type loading table 311b to the test tray 11.

By repeating the above procedure, the first picking apparatus 313 continuously transfers and loads the semiconductor devices from the user trays 30a to the moving type loading tables 311a and 311b, and the second picking apparatus 314 continuously transfers and loads the semiconductor devices from the moving type loading tables 311a and 311b to the test tray 11.

In this embodiment, the first picking apparatus 313 includes the front and rear row pickers 313a and adjusts the pitch between the front and rear rows, thereby adjusting the front/rear pitch between the semiconductor devices, and the second picking apparatus 314 includes the right and left row pickers 314a and adjusts the pitch between the right and left rows, thereby adjusting the right/left pitch between the semiconductor devices. However, the first picking apparatus can be implemented to have pickers arranged merely in the right/left direction. In this case, when the first picking apparatus transfers the semiconductor devices from the user trays to the moving type loading tables, the first picking apparatus loads the semiconductor devices onto the first moving type loading table with their pitches adjusted by controlling the first loading position of the first region and the second loading position of the second region. The second picking apparatus can also be implemented in the same manner.

Second Embodiment

In accordance with a second embodiment of the present invention, a test handler picks up semiconductor devices from user trays, adjusts a right/left pitch between the semiconductor devices, adjusts a front/rear pitch between the semiconductor devices, and loads the semiconductor devices onto a test tray.

Figure 11:
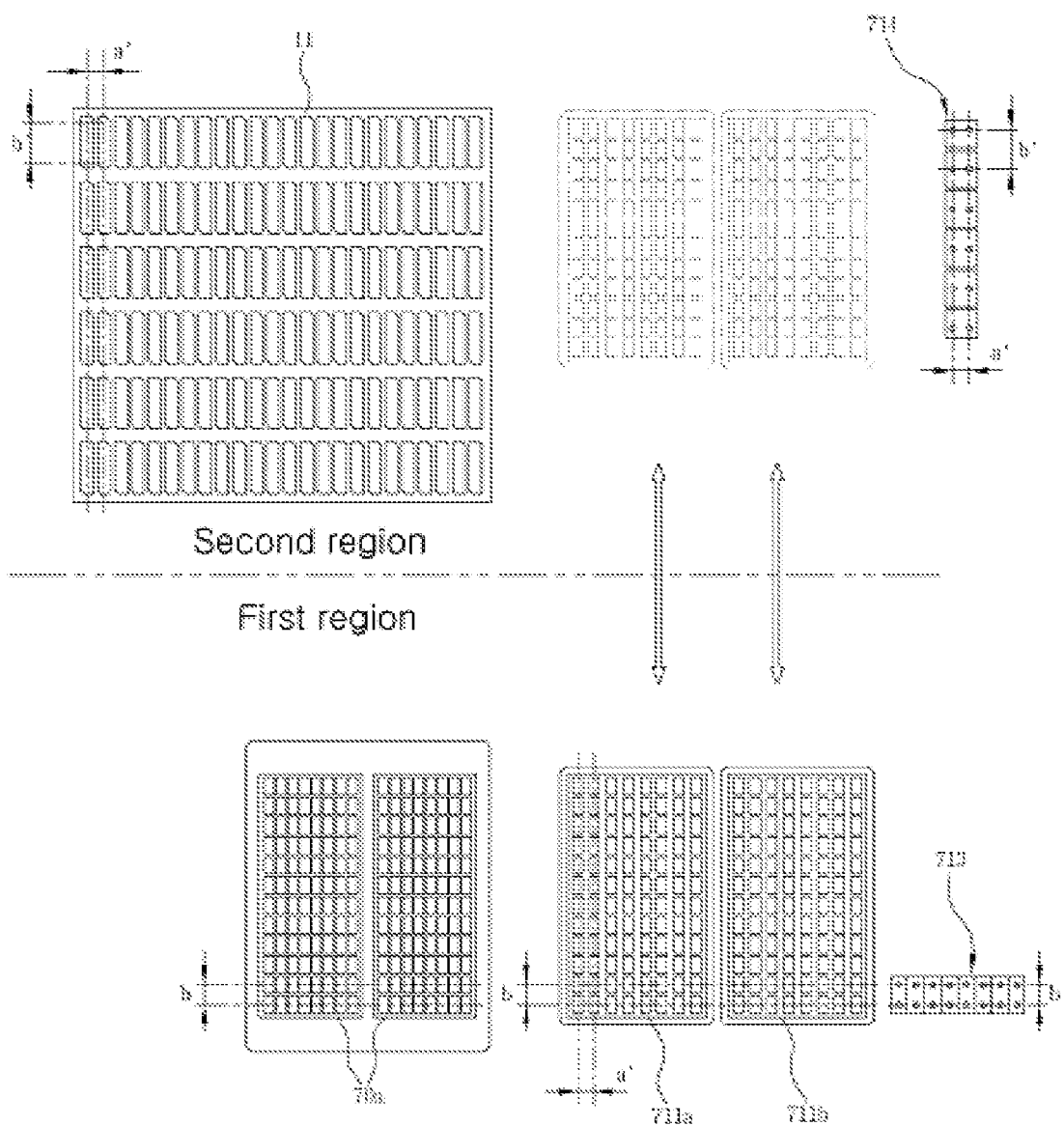
FIG. 11 is a schematic plan view illustrating major elements of a test handler according to a second embodiment of the present invention.

FIG. 11 is a schematic plan view illustrating major elements of the test handler according to a second embodiment of the present invention.

Referring to FIG. 11, a loading unit of the test handler includes a first moving type loading table 711a, a second moving type loading table 711b, a power apparatus (not shown) for reciprocating the first moving type loading table 711a and the second moving type loading table 711b independently of each other, a first picking apparatus 713, and a second picking apparatus 714.

The two moving type loading tables 711a and 711b are reciprocated in the front/rear direction between the side of user trays 70a and the side of a test tray 11, and arranged in parallel with each other in the right and left sides. In addition, a power apparatus reciprocates the two moving type loading tables 711a and 711b independently of each other. A right/left pitch a' between device-settling cells of the moving type loading tables 711a and 711b is identical to a right/left pitch a' between device-settling cells of the test tray 11, and a front/rear pitch b between the device-settling cells of the moving type loading tables 711a and 711b is identical to a front/rear pitch b between the semiconductor devices loaded on the user trays 70a. The semiconductor devices are stably aligned on the device-settling cells of the moving type loading tables 711a and 711b.

The first picking apparatus 713 includes 8 pickers in its front and rear rows, respectively. A right/left pitch between the pickers is adjustable, and a front/rear pitch between the pickers is fixed identically to the front/rear pitch b between the semiconductor devices of the user trays 70a.

The second picking apparatus 714 includes 6 pickers in its right and left rows, respectively. A front/rear pitch between the pickers is adjustable, and a right/left pitch a' between the pickers is fixed identically to the right/left pitch b' between the device-settling cells of the test tray 11.

In the above loading unit, when the first picking apparatus 713 transfers and loads the semiconductor devices from the user trays 70a onto the first or second moving type loading table 711a or 711b positioned in the side of the user trays 70a, namely, positioned in a first loading position of a first region, the first picking apparatus 713 adjusts the right/left pitch. The first or second moving type loading table 711a or 711b on which the semiconductor devices have been loaded is situated in the side of the test tray 11 which is a second loading position of a second region. When the second picking apparatus 714 transfers and loads the semiconductor devices from the first or second moving type loading table 711a or 711b to the test tray 11, the second picking apparatus 714 adjusts the front/rear pitch.

As apparent from the above description, in accordance with exemplary embodiments of the present invention, when the semiconductor devices of the user trays are loaded onto the test tray, the front/rear pitch and the right/left pitch between the semiconductor devices are sequentially adjusted. That is, the front/rear pitch and the right/left pitch between the semiconductor devices are individually adjusted efficiently. Accordingly, the configurations of the picking apparatus are simplified to reduce their weight. As a result, the performance of the loading unit is considerably improved due to high-speed mobility and efficient fast processing.

Although embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A test handler, comprising:
   a loading unit for loading semiconductor devices of user trays onto a test tray;
   a test chamber in which a tester tests the semiconductor devices loaded on the test tray by the loading unit; and
   an unloading unit for unloading the semiconductor devices tested in the test chamber from the test tray onto user trays,
   wherein the loading unit includes:
   at least one moving type loading table, movable between a first region and a second region, having device-settling cells arranged to have a pitch wider in a first direction than a pitch in the first direction between the semiconductor devices loaded on the user trays, the pitch of the device settling cells in the first direction being substantially the same as a pitch in the first direction on the test tray, and a pitch of the device settling cells in a second direction, which is substantially orthogonal to the first direction, being substantially the same as a pitch between the semiconductor devices loaded on the user trays in the second direction;

a first picking apparatus movable in the first region to transfer and load the semiconductor devices from the user trays to the device-settling cells of the moving type loading table positioned in the first region, wherein a pitch of the first picking apparatus in the first direction is adjustable and a pitch of the first picking apparatus in the second direction is fixed; and a second picking apparatus movable in the second region to transfer and load the semiconductor devices from the device-settling cells of the moving type loading table positioned in the second region to the test tray, wherein a pitch of the second picking apparatus in the second direction is adjustable and a pitch of the second picking apparatus in the first direction is fixed and further wherein a pitch of the tray is wider in the second direction than the pitch of the device-settling cells in the second direction.

2. The test handler according to claim 1, wherein the at least one moving type loading table includes a first moving type loading table and a second moving type loading table which are movable independently of each other.

3. A test handler, comprising:
a loading unit for loading semiconductor devices of user trays onto a test tray;
a test chamber in which a tester tests the semiconductor devices loaded on the test tray by the loading unit; and
an unloading unit for unloading the semiconductor devices tested in the test chamber from the test tray onto user trays,
wherein the loading unit includes:
at least one moving type loading table, movable between a first loading position and a second loading position, having device-settling cells arranged to have a pitch wider in a front/rear direction than a pitch in the front/rear direction between the semiconductor devices loaded on the user trays, the pitch of the device settling cells in the front/rear direction being substantially the same as a pitch in the front/rear direction on the test tray, and a pitch of the device settling cells in a right/left direction being substantially the same as a pitch between the semiconductor devices loaded on the user trays in the right/left direction;
a first picking apparatus for adjusting the front/rear pitch between the semiconductor devices in transferring and loading the semiconductor devices from the user trays onto the moving type loading table positioned in the first loading position, wherein the right/left pitch of the first picking apparatus is fixed; and
a second picking apparatus for adjusting a pitch between the semiconductor devices in transferring and loading the semiconductor devices from the moving type loading table positioned in the second loading position onto the test tray;
further wherein, the first picking apparatus includes multiple rows which have a plurality of pickers arranged in the right/left direction, and adjust a pitch between front and rear rows during the movement for adjusting the front/rear pitch between the semiconductor devices;
the second picking apparatus adjust a right/left pitch between the semiconductor devices in transferring and loading the semiconductor devices; and
the second picking apparatus includes multiple columns which have a plurality of pickers arranged in the front/rear direction, and adjust a pitch between right and left columns during the movement for adjusting the right/left pitch between the semiconductor devices.

4. The test handler according to claim 3, wherein the at least one moving type loading table includes a first moving type loading table and a second moving type loading table which are movable independently of each other.

5. The test handler according to claim 3, wherein the second picking apparatus is movable only in the right/left direction.

6. A test handler, comprising:
a loading unit for loading semiconductor devices of user trays onto a test tray;
a test chamber in which a tester tests the semiconductor devices loaded on the test tray by the loading unit; and
an unloading unit for unloading the semiconductor devices tested in the test chamber from the test tray onto user trays,
wherein the loading unit includes:
at least one moving type loading table movable between a first loading position and a second loading position, having device-settling cells arranged to have a pitch wider in a right/left direction than a pitch in the right/left direction between the semiconductor devices loaded on the user trays, the pitch of the device settling cells in the right/left direction being substantially the same as a pitch in the right/left direction on the test tray, and a pitch of the device settling cells in a front/rear direction being substantially the same as a pitch between the semiconductor devices loaded on the user trays in the front/rear direction;
a first picking apparatus for adjusting the right/left pitch between the semiconductor devices in transferring and loading the semiconductor devices from the user trays onto the moving type loading table positioned in the first loading position, wherein a front/rear pitch of the first picking apparatus is fixed; and
a second picking apparatus for adjusting a pitch between the semiconductor devices in transferring and loading the semiconductor devices from the moving type loading table positioned in the second loading position onto the test tray;
further wherein, the second picking apparatus adjust the front/rear pitch between the semiconductor devices in transferring and loading the semiconductor devices.

7. The test handler according to claim 6, wherein at least one moving type loading table includes a first moving type loading table and a second moving type loading table which are movable independently of each other.

* * * * *